United States Patent [19]
Sasaki

[11] Patent Number: 5,911,105
[45] Date of Patent: Jun. 8, 1999

[54] FLASH MEMORY MANUFACTURING METHOD

[75] Inventor: Masakazu Sasaki, Tokyo, Japan

[73] Assignee: NEC Corporation, Tokyo, Japan

[21] Appl. No.: 08/890,404

[22] Filed: Jul. 9, 1997

[30] Foreign Application Priority Data

Jul. 12, 1996 [JP] Japan .................................... 8-183123

[51] Int. Cl.⁶ ............................................ H01L 21/8247
[52] U.S. Cl. .......................................... 438/258; 438/201
[58] Field of Search .................................. 438/201, 211, 438/258, 264, 266, 267

[56] References Cited

U.S. PATENT DOCUMENTS

| | | | |
|---|---|---|---|
| 5,036,018 | 7/1991 | Mazzali | 438/201 |
| 5,153,143 | 10/1992 | Schlais et al. | 438/258 |
| 5,175,120 | 12/1992 | Lee | 438/258 |
| 5,223,451 | 6/1993 | Uemura et al. | 438/258 |

FOREIGN PATENT DOCUMENTS

| | | |
|---|---|---|
| 2-260564 | 10/1990 | Japan . |
| 4-302170 | 10/1992 | Japan . |
| 5-218350 | 8/1993 | Japan . |
| 6-232304 | 8/1994 | Japan . |
| 8-107156 | 4/1996 | Japan . |

OTHER PUBLICATIONS

Japanese Office Action dated Jul. 28, 1998 with English Language translation of Japanese Examiner's comments.

*Primary Examiner*—Chandra Chaudhari
*Attorney, Agent, or Firm*—Whitham, Curtis & Whitham

[57] ABSTRACT

A flash memory manufacturing method according to the present invention comprising the steps of: forming a memory cell formation region, one conductivity type MOS transistor formation region and an MOS transistor formation region opposite in conductivity type to the one conductivity type MOS transistor on a semiconductor substrate; forming a polycrystalline silicon layer on an entire surface; selectively forming a resist film on an entirety of the memory cell formation region and part of the polycrystalline silicon layer which corresponds to gate electrodes in the one conductivity type MOS transistor formation region and the opposite conductivity type MOS transistor formation region; selectively etching the polycrystalline silicon film by using the resist film as a mask and forming gate electrodes on the one conductivity type MOS transistor formation region and the opposite conductivity type MOS transistor formation region, respectively; and after the step of forming the gate electrodes, forming a source and drain region in the one conductivity type MOS transistor formation region by injecting one conductivity type impurities by using the resist film as a mask by ion implantation.

10 Claims, 6 Drawing Sheets

MEMORY CELL PORTION A | N-MOS REGION B OF PERIPHERAL CIRCUIT PORTION | P-MOS REGION C OF PERIPHERAL CIRCUIT PORTION

FLASH MEMORY MANUFACTURING METHOD

BACKGROUND OF THE INVENTION

1. Field of the Invention

The present invention relates to a flash memory manufacturing method and particularly relates to a method of manufacturing a MOS transistor in the memory region and the peripheral circuit region of a flash memory.

2. Description of the Related Art

Conventionally, an EPROM and an EEPROM have been well known as a nonvolatile semiconductor memory device. Among those devices, attention has been particularly paid to a flash memory electrically storing all information simultaneously or in block units.

Figure 1:
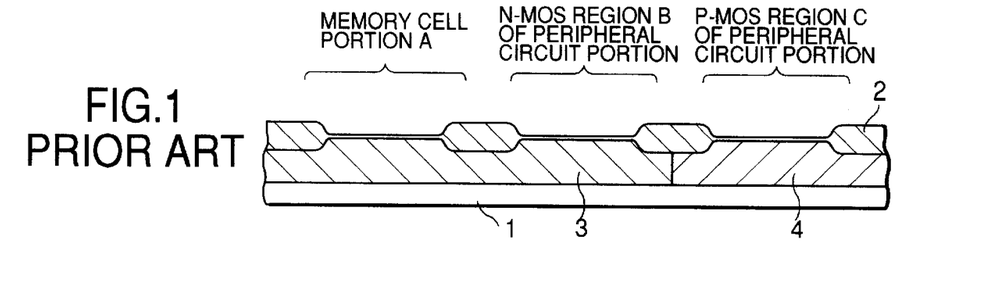
FIGS. 1 through 10 are cross-sectional views for describing a conventional flash memory manufacturing method in the order of manufacturing steps.

The conventional flash memory manufacturing method will be described in the order of manufacturing steps with reference to FIGS. 1 through 10. As shown in FIG. 1, an element isolation region 2 is formed by selectively oxidizing a semiconductor substrate 1, and a memory cell portion A, an nMOS region B of a peripheral circuit portion and a pMOS region C of the peripheral circuit portion are formed. Thereafter, phosphor atoms are injected into the nMOS region B of the peripheral circuit portion by selective ion implantation, while boron atoms are injected into the other regions A and C. Thermal treatment is conducted at 900° C. to 1200° C. to activate the injected impurity atoms, thereby forming a P well 3 and an N well 4.

Figure 2:
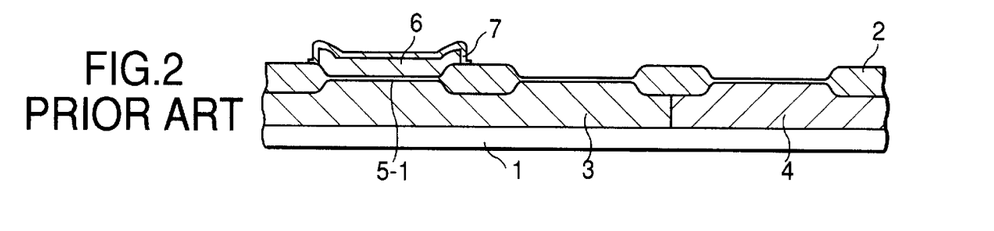

Next, as shown in FIG. 2, after exposing the surface of the semiconductor substrate 1 in the element isolation region, thermal treatment is conducted to thereby form a tunnel oxide film 5-1 having a thickness of 10 to 15 nm and to form a first polycrystalline silicon film 6 and an insulation film 7 having a thickness of 100 to 250 nm only on the memory cell portion A.

Figure 3:
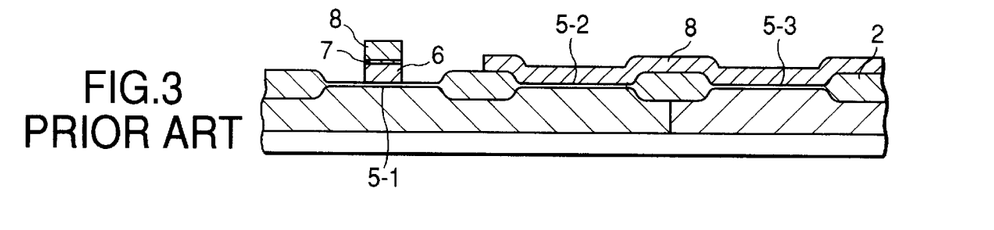

Now, as shown in FIG. 3, the tunnel oxide film in the nMOS region B and pMOS region C of the peripheral circuit portion is removed and thermally oxidized. Thus, gate oxide films 5-2 and 5-3 are provided on the peripheral circuit portion and a second polycrystalline silicon film 8 is provided on the entire surface. A high melting point metal film such as tungsten and molybdenum or a high melting point metal silicide film mixed with silicon is sometimes formed on the second polycrystalline silicon film 8.

The second polycrystalline silicon film 8, the insulating film 7 and the first polycrystalline silicon film 6 on the memory cell portion A are selectively etched, thereby selectively forming a floating gate electrode 6 and a control gate 8. In a source and drain region of a hot electron type memory cell, write operation is conducted by storing information by applying a voltage of approximately 5 V to a drain and a voltage of appropriately 12 V to a control gate electrode and trapping hot electrons generated between the source and drain into the floating gate electrode. Meanwhile, erase operation is conducted by erasing information by applying a voltage of approximately 0 V and a voltage of approximately 12 V are applied to the control gate electrode and the source, respectively and absorbing electrons of the floating gate electrode. Therefore, the drain only consists of an N-type high concentration layer so as to easily generate hot electrons and the drain has a structure that a surface where the N-type high concentration layer contacts with the P well 3 is covered with a low concentration N-type layer so as not to generate hot electrons when a voltage of approximately 12 V is applied while erase operation is being conducted.

To form a source and a drain, high concentration N-type impurity atoms such as arsenic of a concentration of approximately $1 \times 10^{16}$ atms/cm$^2$ are injected only into the drain region 9-2 and the source region 9-1 of the memory cell portion and N-type impurity atoms such as phosphor having a concentration of approximately $1 \times 10^{14}$ atms/cm$^2$ are injected only into the source region 9-1 by ion implantation. Thermal treatment is conducted at 900 to 1000 ° C. to activate arsenic and phosphor atoms. During the thermal treatment, the diffusion speed of phosphor is higher than that of arsenic. Due to this, the high concentration source region 9-1 is covered with the low concentration N-type source region 9-3.

Figure 4:
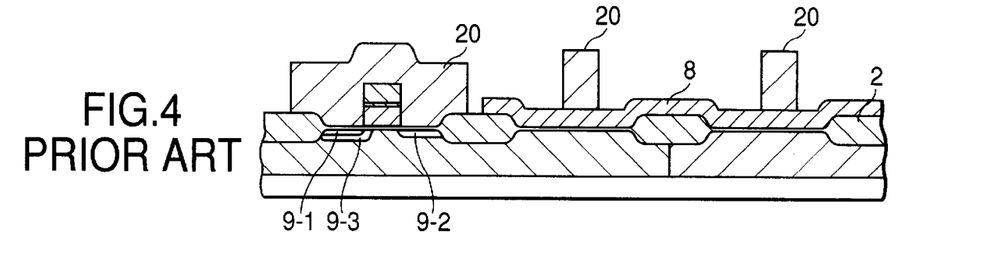

As shown in FIG. 4, a photoresist film 20 for forming gate electrodes on the peripheral circuit portion is patterned.

Figure 5:
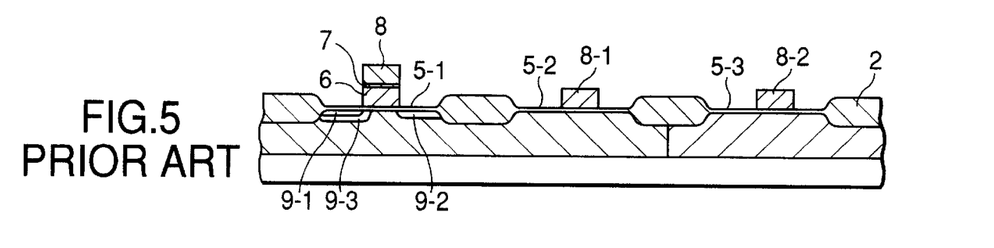

As shown in FIG. 5, using the photoresist film 20 as a mask, the polycrystalline silicon film 8 is selectively etched, to thereby form gate electrodes 8-1 and 8-2. Thereafter, the photoresist film 20 is removed.

Figure 6:
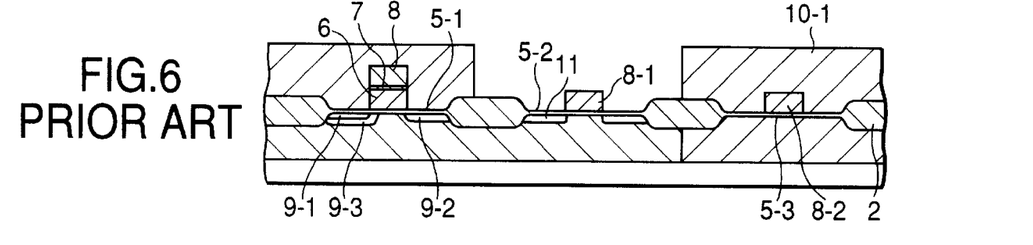

As shown in FIG. 6, the memory cell portion A and the pMOS region C of the peripheral circuit portion are selectively covered with a photoresist 10-1. Low concentration N-type impurity atoms such as phosphor of a concentration of approximately $1 \times 10^{13}$ to $5 \times 10^{13}$ atms/cm$^2$ are selectively injected into the nMOS region B of the peripheral circuit portion by ion implantation, thereby forming a low concentration source and drain region 11.

Figure 7:
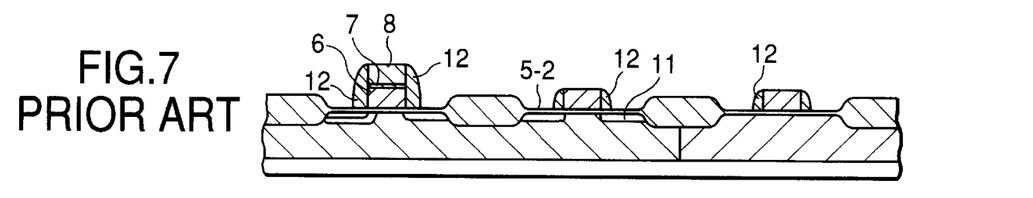
Figure 8:
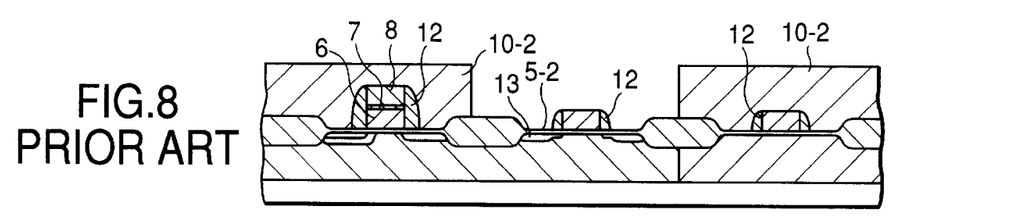

As shown in FIG. 7, the photoresist 10-1 is removed and a chemical vapor deposition oxide film is provided on the entire surface of the substrate. The entire surface of the substrate is anisotropically etched and oxide films 12 are formed only the side surfaces of the gate electrodes 6-1, 8a, 8-1 and 8-2 in a self-aligned manner, respectively. As shown in FIG. 8, portions other than the nMOS region B of the peripheral circuit portion are covered with a photoresist 10-2 and, for example, arsenic atoms of a concentration of $1 \times 10^{15}$ to $1 \times 10^{16}$ atms/cm$^2$ are injected to thereby form a high concentration N-type source and drain region 13 in the nMOS region B of the peripheral circuit portion by ion implantation.

Figure 9:
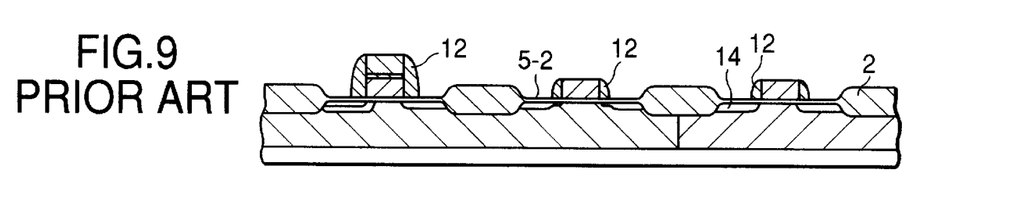

As shown in FIG. 9, boron atoms of a concentration of $1 \times 10^{15}$ to $1 \times 10^{16}$ atms/cm$^2$ are injected into the pMOS region C of the peripheral circuit portion by ion implantation to thereby form a high concentration P-type source and drain region 14.

Figure 10:
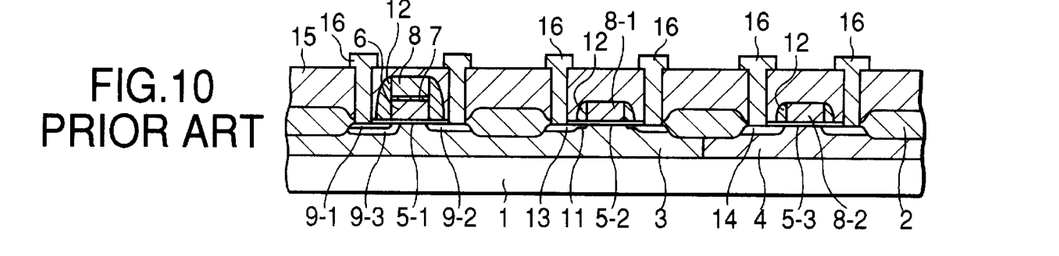
Figure 11:
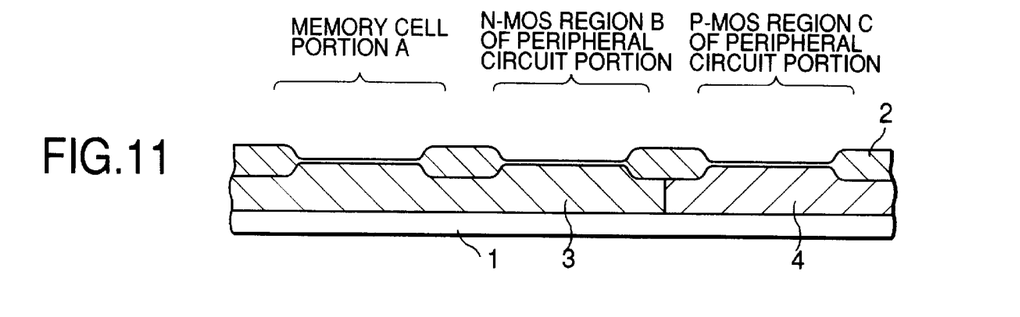
FIGS. 11 through 19 are cross-sectional views for describing a first embodiment according to the present invention in the order of manufacturing steps.
Figure 12:
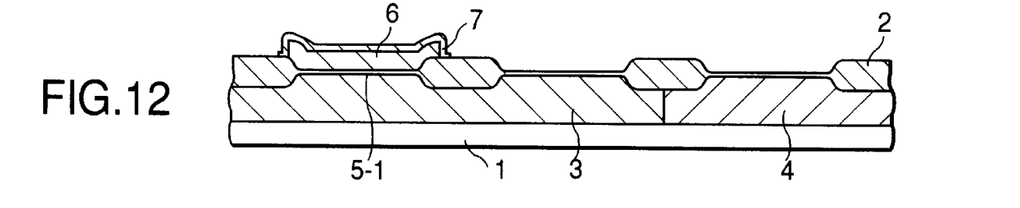
Figure 13:
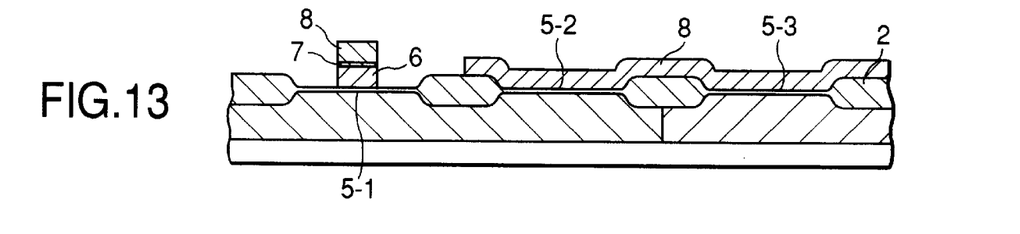

As shown in FIG. 10, an interlayer insulating film 15 such as a chemical vapor deposition oxide film is formed on the entire surface of the substrate. Opening portions are selectively provided in the source, drain and gate electrodes. Electrodes 16 of aluminum are selectively formed to cover the openings.

Since the conventional manufacturing method as mentioned above requires many manufacturing steps, it has disadvantages in that yield is lowered and manufacturing cost is increased.

SUMMARY OF THE INVENTION

It is therefore an object of the present invention to provide a flash memory manufacturing method capable of reducing manufacturing steps.

A flash memory manufacturing method according to the present invention comprising the steps of: forming a memory cell formation region, one conductivity type MOS transistor formation region and an MOS transistor formation region opposite in conductivity type to the one conductivity type MOS transistor on a semiconductor substrate; forming a polycrystalline silicon layer on an entire surface; selectively forming a resist film on an entirety of the memory cell formation region and part of the polycrystalline silicon layer which corresponds to gate electrodes in the one conductivity type MOS transistor formation region and the opposite conductivity type MOS transistor formation region; selectively etching the polycrystalline silicon film by using the resist film as a mask and forming gate electrodes on the one conductivity type MOS transistor formation region and the opposite conductivity type MOS transistor formation region, respectively; and after the step of forming the gate electrodes, forming a source and drain region in the one conductivity type MOS transistor formation region by injecting one conductivity type impurities by using the resist film as a mask by ion implantation.

BRIEF DESCRIPTION OF THE DRAWINGS

This above-mentioned and other objects, features and advantages of this invention will become more apparent by reference to the following detailed description of the invention taken in conduction with the accompanying drawings, wherein.

DETAILED DESCRIPTION OF THE PREFERRED EMBODIMENTS

A first embodiment according to the present invention will be described with reference to FIGS. 11 through 19.

Figure 14:
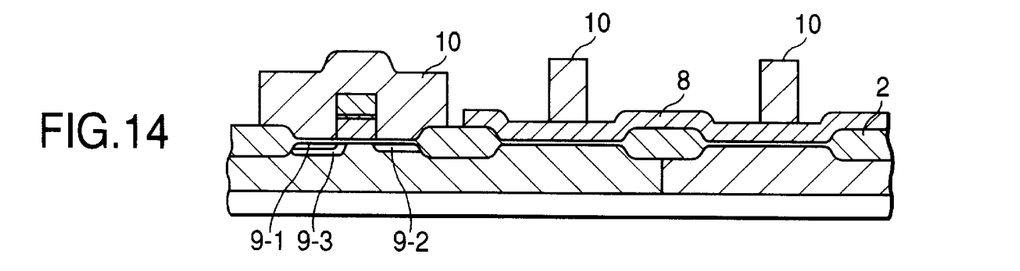

Manufacturing steps illustrated in FIGS. 11 through 14 which are the same as those in prior art FIGS. 1 through 4, will not described herein. As shown in FIG. 14, a photoresist film 10 is selectively formed on memory cell portion A and part of a polycrystalline silicon film 8 which will become gate electrodes. Using the photoresist film 10 as a mask, anisotropic etching is conducted using, for example, $SF_6$ gas, thereby forming gate electrodes 8-1 and 8-2 in an nMOS region B and a pMOS region C of a peripheral circuit portion.

Figure 15:
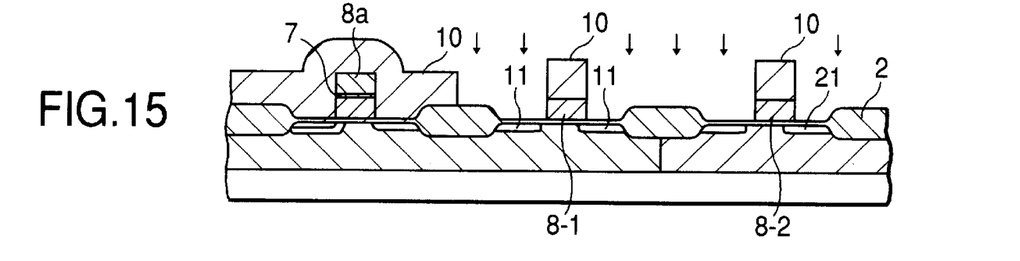

As shown in FIG. 15, using the photoresist film 10 as a mask again, low concentration N-type impurities such as phosphor of a concentration of approximately $1\times10^{14}$ atms/$cm^2$ are injected by ion implantation to form a low concentration source and drain region 11 in the nMOS region B. Although an N-type impurity region 21 s also formed in the pMOS region, P-type impurities are injected by ion implantation in the later step and the N-type impurity region 21 is to be eliminated.

The above described step is quite characteristic of the present invention. That is, to form a low concentration source and drain region 11 in the nMOS region, the step of forming a photoresist film 10-1 is required in the prior art method. According to the present invention, by contrast, the photoresist film 10 for forming gate electrodes is also used as a mask for forming a low concentration source and drain region in the nMOS region B. As a result, the step of forming a photoresist film for forming the region 11 can be eliminated and the number of steps can be reduced.

Furthermore, it should be emphasized that the photoresist film 10 is formed on the memory cell portion A. If the photoresist film 10 is not formed thereon, N-type impurity atoms are injected into the memory cell portion A, too, by ion implantation, with the result that a high concentration source and drain region is formed and a drain region is made up of two kinds of impurities, i.e., high concentration N-type arsenic and low concentration phosphor. If so, phosphor is diffused faster than arsenic by thermal treatment in the later step and the drain region as well as the source region is made up of two N-type layers.

As a result, even if a voltage of 5 V is applied in write operation, the presence of the low concentration N-type impurity region causes the strength of an electric field between the source and the drain to be weakened. In addition, hot electrons are less generated, write speed slows down or write operation cannot be conducted at worst.

Figure 16:
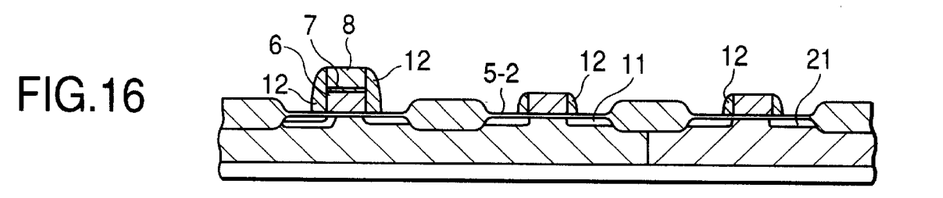
Figure 17:
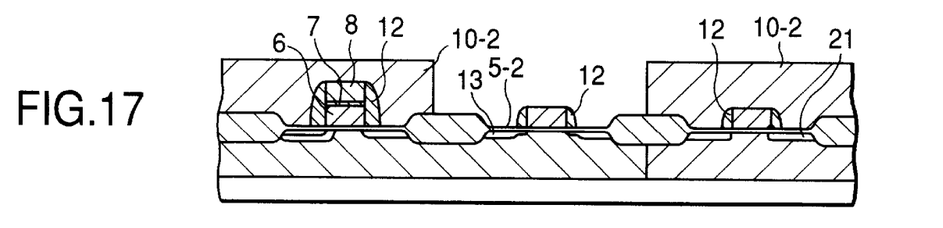
Figure 18:
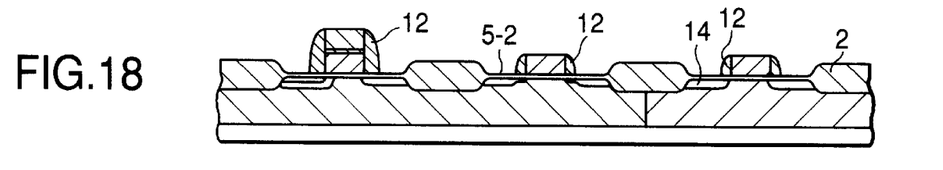
Figure 19:
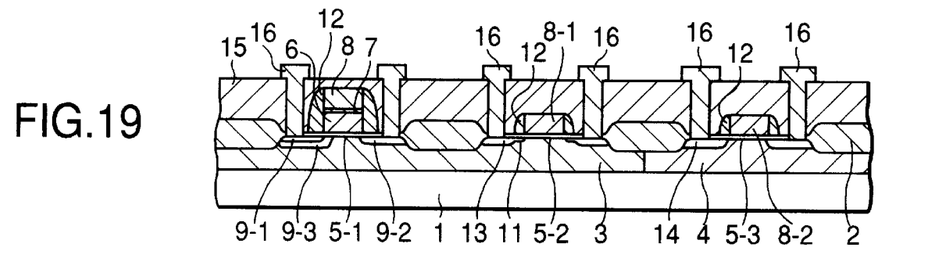

Next, after the photoresist film 10 is removed, an oxide film 12 is formed on side surfaces of the gate electrodes, respectively as shown in FIG. 16. Manufacturing steps as illustrate in FIGS. 16 through 19 are the same as those in prior art FIGS. 7 through 10 except for the following matters. No description thereto will therefore be given herein. The difference between the present invention and the prior art method is that an N-type impurity region 21 is formed in the pMOS region as shown in FIG. 16. The N-type impurity region 21 is eliminated by injecting high concentration boron atoms into the pMOS region C of the peripheral circuit portion by ion implantation and a high concentration P-type source and drain region 14 is formed.

A second embodiment according to the present invention will described with reference to FIGS. 20 through 28.

Figure 20:
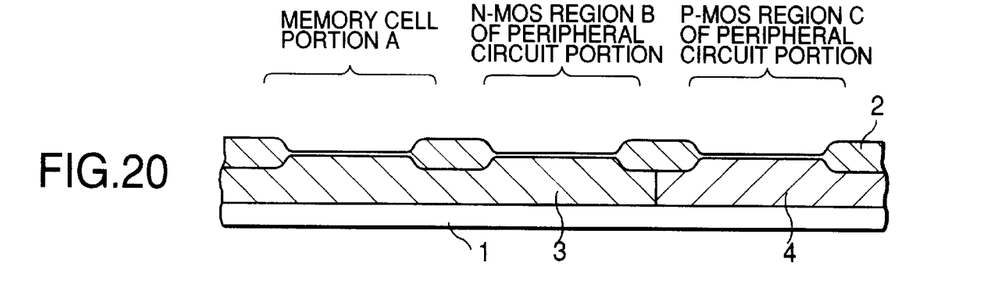
FIGS. 20 through 28 are cross-sectional views for describing a second embodiment according to the present invention in the order of manufacturing steps.
Figure 21:
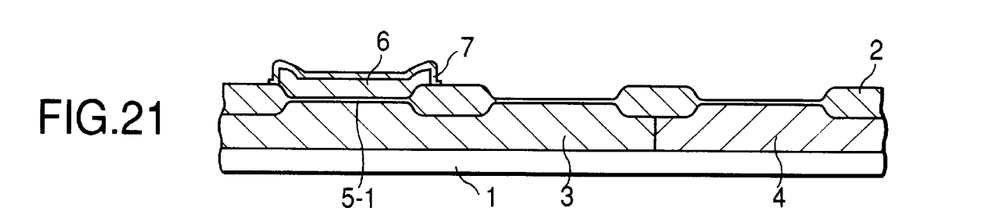
Figure 22:
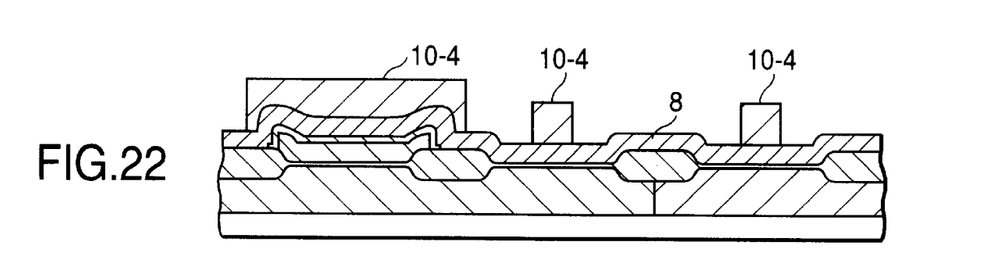

Since manufacturing steps illustrated in FIGS. 20 and 21 are the same as those in prior art FIGS. 1 and 2, no description thereto will be given herein. As shown in FIG. 22, a polycrystalline silicon film 8 is formed on the entire surface. A photoresist film 10-4 is selectively formed on the memory cell portion A and part of the polycrystalline silicon film 8 which will become gate electrodes.

Figure 23:
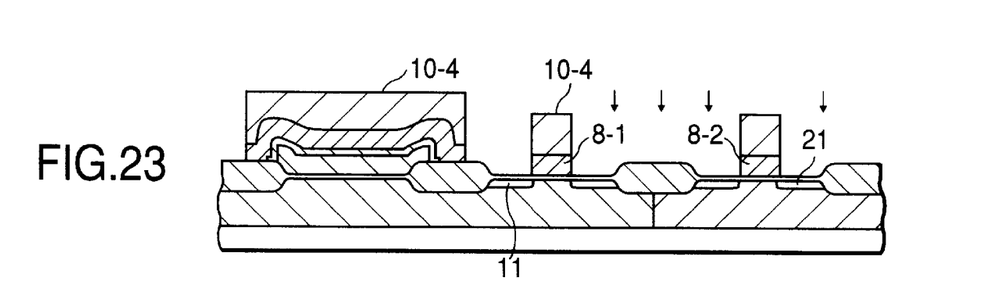

As shown in FIG. 23, using the photoresist film 10-4 as a mask, anisotropic etching is conducted by using, for example, $SF_6$ gas, thereby forming gate electrodes 8-1 and 8-2 in the nMOS region B and pMOS region C of the peripheral circuit portion. Using the photoresist film as a mask again, low concentration N-type impurities such as phosphor of a concentration of $1\times10^{14}$ atms/$cm^2$ are injected by ion implantation to thereby form a low concentration source and drain region 11 in the nMOS region B. Although an N-type impurity region 21 is also formed in the pMOS region, P-type impurities are injected by ion implantation in the later step and the region 21 is to be eliminated. A manufacturing step shown in FIG. 23 corresponds to that of the first embodiment shown in FIG. 15. That is, as in the case of the first embodiment, the photoresist film 10 for forming gate electrodes is also used as a mask for forming a low concentration source and drain region 11 in the nMOS region B in this embodiment. The step of forming a photoresist film for forming the source and drain region 11 can be eliminated and therefore the number of manufacturing steps can be reduced.

Figure 24:
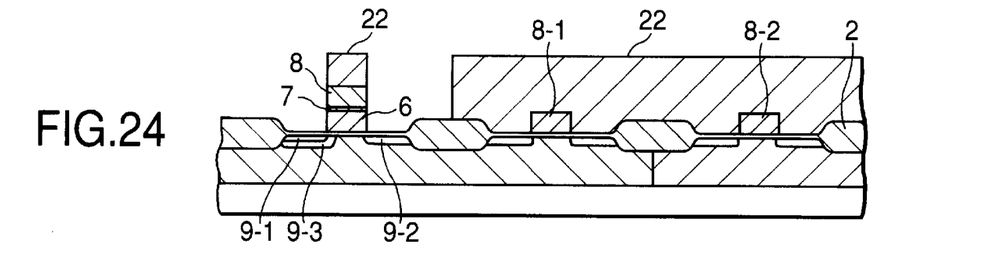
Figure 25:
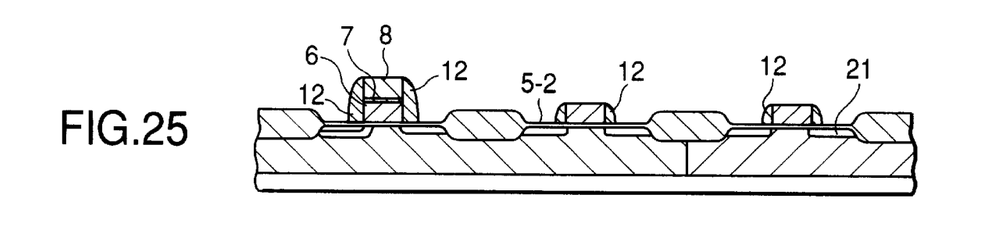
Figure 26:
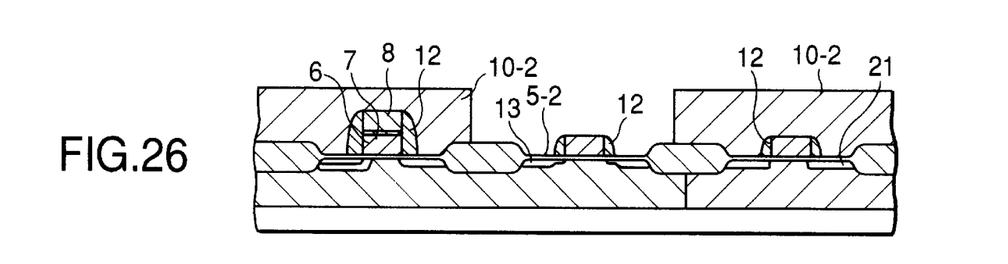
Figure 27:
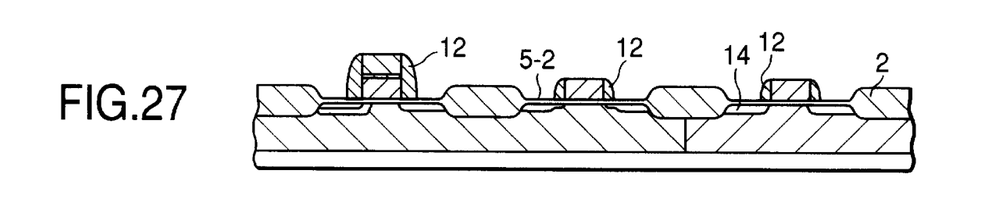
Figure 28:
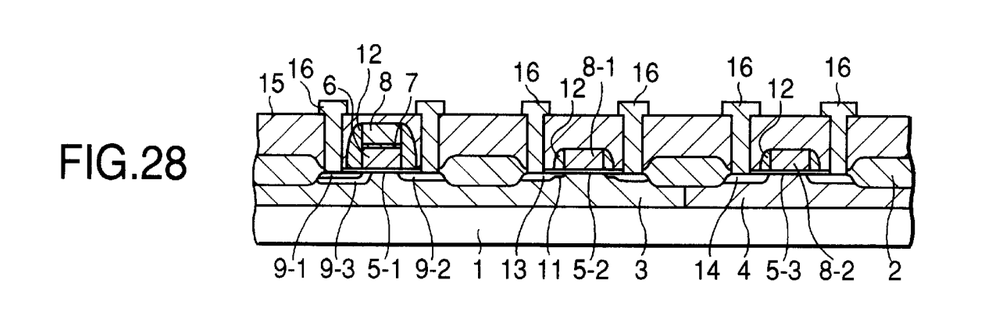

As shown in FIG. 24, a photoresist film 22 is selectively formed in the nMOS region B and pMOS region C of the peripheral circuit portion and on part of the memory cell portion A which will become gate electrodes. A high concentration source region 9-1, a drain region 9-2 and a low concentration N-type source region 9-3 are formed under the same ion implantation conditions as those in the step shown in FIG. 4. Thereafter, the photoresist film 22 is removed.

Manufacturing steps illustrated in FIGS. 25 through 28 are the same as those of the first embodiment shown in FIGS. 16 through 19, which description will be therefore not given.

Although the invention has been described with reference to specific embodiments, this description should not be construed in a limited sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A flash memory manufacturing method comprising the steps of:

forming a memory cell formation region, one conductivity type MOS transistor formation region and an MOS transistor formation region opposite in conductivity type to said one conductivity type MOS transistor on a semiconductor substrate;

forming a polycrystalline silicon layer on an entire surface;

selectively forming a resist film on an entirety of said memory cell formation region and part of said polycrystalline silicon layer which corresponds to gate electrodes in said one conductivity type MOS transistor formation region and said opposite conductivity type MOS transistor formation region;

selectively etching said polycrystalline silicon film by using said resist film as a mask and forming gate electrodes on said one conductivity type MOS transistor formation region and said opposite conductivity type MOS transistor formation region, respectively; and after the step of forming said gate electrodes, forming a source and drain region in said one conductivity type MOS transistor formation region by injecting one conductivity type impurities by using said resist film as a mask by ion implantation.

2. A method according to claim 1, wherein said one conductivity type MOS transistor formation region and said opposite conductivity type MOS transistor formation region are formed on a peripheral circuit portion.

3. A method according to claim 1, wherein selective etching of said polycrystalline silicon film by using said resist film as a mask is anisotropic etching.

4. A method according to claim 1, further comprising the step of forming a floating gate electrode and a control gate electrode in said memory cell formation region.

5. A method according to claim 1, further comprising the step of forming a source and drain region by selectively injecting opposite conductivity type impurities into said opposite conductivity type MOS transistor formation region by ion implantation.

6. A flash memory manufacturing method comprising the steps of:

forming a memory cell formation region, a one conductivity type MOS transistor formation region and an opposite conductivity type MOS transistor formation region on a semiconductor substrate;

forming a first oxide film, a first polycrystalline silicon film and a second insulating film on said memory cell formation region;

forming a second polycrystalline silicon film on an entire surface;

forming gate electrodes by selectively etching said first polycrystalline silicon film, said second insulating film and said second polycrystalline silicon film on said memory cell formation region;

selectively forming a resist film on an entirety of said memory cell formation region, part of said polycrystalline silicon layer corresponding to gate electrodes of said one conductivity type MOS transistor formation region and said opposite conductivity type MOS transistor formation region;

forming gate electrodes on said one conductivity type MOS transistor formation region and said opposite conductivity type MOS transistor formation region by selectively etching said polycrystalline silicon film by using said resist film as a mask;

after the step of forming said gate electrodes, forming a source and drain region on said one conductivity type MOS transistor formation region by injecting one conductivity type impurities into said one conductivity type MOS transistor formation region by using said resist film as a mask by ion implantation; and forming a source and drain region by selectively injecting opposite conductivity type impurities into said opposite conductivity type MOS transistor formation region by ion implantation.

7. A method according to claim 6, wherein said one conductivity type MOS transistor formation region and said opposite conductivity type MOS transistor formation region are formed on a peripheral circuit portion.

8. A method according to claim 6, wherein selective etching of said polycrystalline silicon film by using said resist film as a mask is anisotropic etching.

9. A flash memory manufacturing method comprising the steps of:

forming a memory cell formation region, one conductivity type MOS transistor formation region and an MOS transistor formation region opposite in conductivity type to said one conductivity type MOS transistor on a semiconductor substrate;

forming consecutively a first oxide film, a first polycrystalline silicon film and a second insulating film on said memory cell formation region;

forming a polycrystalline silicon film on an entire surface;

selectively forming a first resist film on an entirety of said memory cell formation region and part of said polycrystalline silicon layer corresponding to gate electrodes of said one conductivity type MOS transistor formation region and said opposite conductivity type MOS transistor formation region;

forming gate electrodes on said one conductivity type MOS transistor formation region and said opposite conductivity type MOS transistor formation region, respectively by selectively etching said polycrystalline silicon film by using said first resist film as a mask;

after the step of forming said gate electrodes, forming a source and drain region on said one conductivity type MOS transistor formation region by injecting one conductivity type impurities into said one conductivity type MOS transistor formation region by using said first resist film as a mask by ion implantation;

selectively forming a second resist film on portions corresponding to the gate electrodes on said one conductivity type MOS transistor formation region, said opposite conductivity type MOS transistor formation region and said memory cell formation region;

forming gate electrodes on said memory cell formation region by selectively removing said first polycrystalline silicon film, said second insulating film and said second polycrystalline silicon film by using said second resist film as a mask;

forming a source and drain region by injecting one conductivity type impurities into said memory cell formation region by ion implantation; and forming a source and drain region by injecting opposite conductivity type impurities into said opposite conductivity type MOS transistor formation region by ion implantation.

10. A method according to claim 9, wherein selective etching of said polycrystalline silicon film by using said resist film as a mask is anisotropic etching.

* * * * *